US011990591B2

(12) United States Patent
Myers et al.

(10) Patent No.: US 11,990,591 B2
(45) Date of Patent: May 21, 2024

(54) METHOD FOR MONITORING SERIES-CONNECTED BATTERY CELLS

(71) Applicant: LiTech Laboratories, LLC, Austin, TX (US)

(72) Inventors: Robert L. Myers, Austin, TX (US); Alexei Tikhonski, Austin, TX (US); James P. Novak, Austin, TX (US)

(73) Assignee: Litech Laboratories, Inc., Austin, TX (US)

( * ) Notice: Subject to any disclaimer, the term of this patent is extended or adjusted under 35 U.S.C. 154(b) by 112 days.

(21) Appl. No.: 17/473,933

(22) Filed: Sep. 13, 2021

(65) Prior Publication Data

US 2021/0408615 A1     Dec. 30, 2021

Related U.S. Application Data

(63) Continuation-in-part of application No. 16/471,961, filed as application No. PCT/US2017/045468 on Aug. 4, 2017, now Pat. No. 11,121,415.

(60) Provisional application No. 62/456,371, filed on Feb. 8, 2017.

(51) Int. Cl.
*H01M 10/48* (2006.01)
*G01R 31/385* (2019.01)

(52) U.S. Cl.
CPC ........ *H01M 10/482* (2013.01); *G01R 31/385* (2019.01); *H01M 10/486* (2013.01); *H01M 10/488* (2013.01)

(58) Field of Classification Search
CPC ...... H01M 10/48; H01M 10/42; H01M 10/50; H01M 10/40
See application file for complete search history.

(56) References Cited

U.S. PATENT DOCUMENTS

| 5,037,756 | A | 8/1991 | Bollum |
| 6,275,042 | B1 | 8/2001 | Tsai |
| 2007/0194750 | A1* | 8/2007 | Eager ............... H02J 7/0068 320/110 |
| 2008/0116852 | A1 | 5/2008 | Kuo |
| 2010/0194340 | A1 | 8/2010 | Lim |

(Continued)

FOREIGN PATENT DOCUMENTS

| CN | 101022180 A | 8/2007 |
| EP | 2216872 A2 | 8/2010 |

(Continued)

OTHER PUBLICATIONS

Russian International Searching Authority; International Search Report & Written Opinoin for PCT/US2017/045468; dated Nov. 17, 2017; 8 pages.
On Semiconductor; Battery Fuel Gauge IC (LC709203F); Battery Fuel Gauge IC for 1-Cell Lithium-ion (Li+); Application Note Ver2.00; 16 pages; downloaded from the Internet on Jun. 23, 2017; Semiconductor Components Industries, LLC; Phoenix, AZ; US.

(Continued)

*Primary Examiner* — Kenneth J Douyette
(74) *Attorney, Agent, or Firm* — Jerry M. Keys; Susan M. Maze; Matheson Keys & Kordzik PLLC

(57) ABSTRACT

A power control system measures individual battery cell voltages and temperatures of a plurality of series-connected battery cells utilizing an Analog Front End, a controller that collects and analyzes the data digitally transferred to it by the Analog Front End, and a Fuel Gauge. Processes performed within the controller are configured to provide optimized representations of the data to the Fuel Gauge to improve its performance.

8 Claims, 9 Drawing Sheets

(56) References Cited

U.S. PATENT DOCUMENTS

| | | | |
|---|---|---|---|
| 2013/0045404 A1* | 2/2013 | Shi | H01M 10/425 324/426 |
| 2015/0137820 A1* | 5/2015 | Mikuteit | G01R 31/3644 324/426 |
| 2015/0145467 A1 | 5/2015 | Zhu et al. | |
| 2015/0380966 A1 | 12/2015 | Alessandro et al. | |
| 2016/0260943 A1 | 9/2016 | Tamburrino | |

FOREIGN PATENT DOCUMENTS

| | | |
|---|---|---|
| JP | 2000-092733 A | 3/2000 |
| JP | 2007-240523 A | 9/2007 |
| JP | 2010-1883829 A | 8/2010 |
| JP | 2010-255857 A | 9/2010 |
| JP | 2010213445 A | 9/2010 |
| JP | 2016121931 A | 7/2016 |

OTHER PUBLICATIONS

Texas Instrucments; Multicell Li-Ion and Li-Pol Battery Gas-Gauge Application Using the bq26500; Application report SLUA300; 5 pages; Jan. 2004; Dallas, TX; US.

Karpink Oleksandr; Power Management—Battery Charger with Cell-Balancing and Fuel Gauge Function Support; Document No. 001-15223 Rev. C; 14 pages; @Cypress Semiconductor Corporation, 2007-2017; San Jose, CA; US.

European Patent Office; European Extended Search Report for corresponding Serial No. 17896129.8; dated Dec. 4, 2020; 7 pages; Munich, DE.

Japanese Patent Office; Office Action issued for corresponding JP Application No. 2019-536291; dated Apr. 12, 2021; 4 pages; Tokyo, JP.

\* cited by examiner

METHOD FOR MONITORING SERIES-CONNECTED BATTERY CELLS

This application is a continuation-in-part of U.S. patent application Ser. No. 16/471,961, issued as U.S. Pat. No. 11,121,415, which is a national phase application of International application no. PCT/US2017/045468, which claims priority to U.S. provisional patent application Ser. No. 62/456,371, all of which are hereby incorporated by reference herein.

TECHNICAL FIELD

The present disclosure relates in general to battery technology, and in particular, to a power control system for monitoring battery cells.

BACKGROUND INFORMATION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Modern electronics are becoming more diverse and increasingly portable, driving demand for improvements in the performance of batteries and battery management systems. With increasing capabilities and performance, power demands are also increasing. The Smart Battery System ("SBS") specification was created to optimize performance, extend battery lifetime, and provide industry standard uniformity to the monitored parameters within a battery system. Integrated circuits ("IC") have been created and programmed with internal software routines to allow batteries to operate in accordance with the SBS specification. Examples of the types of ICs that have been developed for use in battery systems include Analog Front End ("AFE") measurement systems, which are usually combined with some type of Fuel Gauge IC that is intended to precisely estimate state of charge ("SOC") and the amount of remaining energy stored in a battery. In some cases, these two functional components are combined into one package.

High cell count battery packs (i.e., configured with greater than four battery cells in series to increase the terminal voltage of the battery pack) and high discharge rate battery cells (i.e., where the discharge rate exceeds five times capacity (5C)) present new challenges related to fuel gauging accuracy and decision making to properly assess battery health, as well as optimize performance.

Popular integrated circuit-based industry standard algorithms for battery fuel gauging include Impedance Track ("IT") by Texas Instruments and the ModelGauge m3 and m5 algorithms available from Maxim Integrated. These algorithms utilize instantaneous temperature, voltage, and current inputs to estimate SOC and remaining charge. By integrating the amount of charge passed into and out of the battery pack during charge and discharge events, respectively, and combining this measurement of accumulated passed charge with high-accuracy cell voltage and temperature measurements, the devices are able to derive a dependable and accurate estimate of the instantaneous SOC of the battery and remaining battery capacity.

The overwhelming majority of Fuel Gauge ICs sold today are intended for single battery cell applications, such as cell phones, MP3 players, and some tablet computers. These "single cell" Fuel Gauge ICs are the lowest cost parts available on the market suitable for this purpose. These are commonly referred to as 1S gauges (indicating that they are for use with 1 series cell). Fuel Gauge ICs exist for applications like notebook computers that use multiple cells connected in series, but these are usually limited to 4 cell configurations (4S gauges). There are very few choices available on the market that are optimized for series cell counts higher than 4, and almost none for cell counts higher than 6.

Additionally, innovation and fuel gauging algorithm performance enhancements are occurring first in the high-volume single cell gauges, and are slow to come to the multiple cell count ICs. There exists a significant advantage in both cost and performance if single cell ICs could be effectively utilized in multiple cell applications.

A typical circuit configuration for single cell battery fuel gauging is illustrated in FIG. 1. The fuel gauge IC contains a single analog input for measurement of each critical parameter—cell terminal voltage, a voltage corresponding to cell temperature (often using an inexpensive thermistor), and battery charge and discharge current (using a low value current sense resistor). There are no provisions for measuring the voltage or temperature of more than one cell.

DETAILED DESCRIPTION

The following terminology is based on some commonly used terms related to batteries and systems containing batteries. The terms discharging or discharge refer to a process of converting chemical energy within the battery to electrical energy. When a battery discharges, the energy is transferred in the form of electrical current from the battery or battery system to a load to do work. The terms charging or charge refer to the process of doing work on a battery in the form of electrical potential to cause a reversible reaction to increase the chemical energy in a battery. When charging, electrical current flows from an energy source into the battery. The terms rest or resting refer to a battery that is neither in a state of charging or discharging. No electrical current is flowing from the battery during rest. Fuel gauge and the process of fuel gauging refer to the chipset and processes, respectively, used to determine the capacity of a battery at a given moment in time. Fuel gauging may also refer to determining the relative state of charge (i.e., the amount of chemical energy within or how "full" or "empty" is the battery). The fuel gauging process is based on analog measurements of voltage and temperature and time-based integration of current flowing into and out of the battery, as well as any temperature compensations required to properly determine capacity at a given moment of time.

Figure 2:
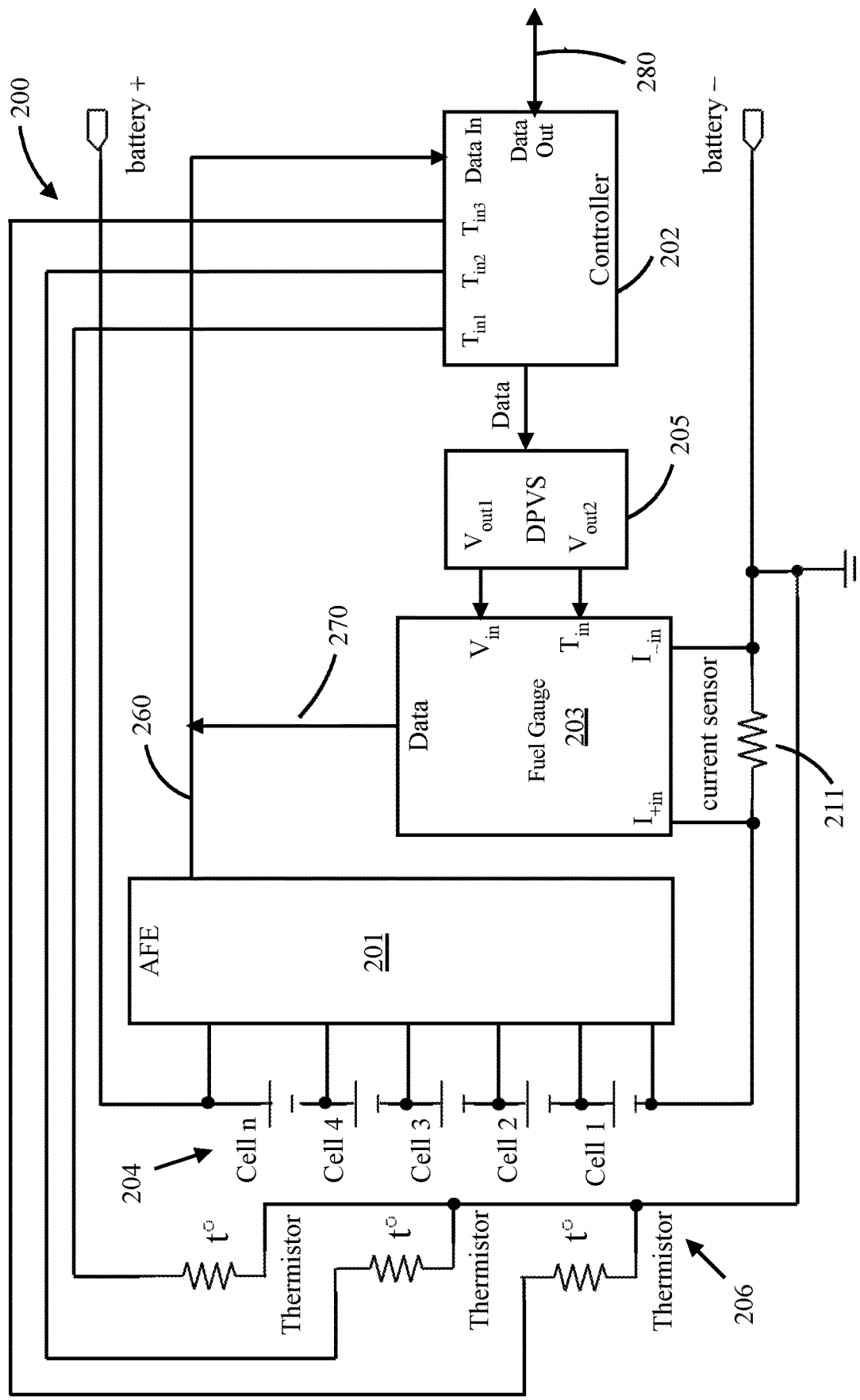
FIG. 2 illustrates a block diagram of a power control system configured in accordance with embodiments of the present disclosure.

Referring to FIG. 2, embodiments of the present disclosure provide a power control system 200 utilizing an Analog Front End measurement circuit 201 (which may also be referred to herein as simply an "analog front end" or "AFE" and which may be implemented as an IC) for measuring individual cell voltages of a plurality of series-connected battery cells 204 (also referred to herein as the "battery assembly" or the "battery pack"). The AFE 201 may be configured so that each channel of the AFE 201 takes a singular measurement of voltage pertaining to a particular battery cell within the battery assembly 204. The position of each battery cell relative to the other battery cells within the battery assembly 204 and the measurement of the voltage of that battery cell may be assigned to each unique specific channel in the AFE 201. The battery cells are arranged in a battery assembly with a physical position. The term cell position or position of the cell are used interchangeably and relate to the physical position of each of the n battery cells relative to the other battery cells in a battery assembly. The AFE 201 has assigned channels for the positions of each of the n battery cells.

Multiple AFEs 201 can be electrically coupled when the number of battery cells exceeds the number of available channels on a single AFE IC 201. In very high cell count battery assemblies 204, two or more such AFE circuits, or ICs 201, could be "stacked," allowing the battery cell count (i.e., n) to increase from tens to hundreds of battery cells. Applications of such high cell counts are common in the automotive industry. In such a configuration, the measured battery cell voltages may be collected by the controller 202 from the plurality of AFE's 201 across the digital communication connection 260, and the controller 202 could interpret the measured battery cell voltages and execute programmed logical operations and optimizations based upon the current state of the battery assembly 204 (e.g., as further described with the examples illustrated in FIGS. 5-8).

The AFE 201 may be configured to make repeated measurements of voltage at sub-one second time scales. The AFE may be any suitable commercially available AFE (e.g., model no. MAX11068 commercially available from Maxim Integrated), or any other equivalent device that operates in a functionally similar manner. Multiple AFEs can be electrically coupled to each other.

Figure 8:
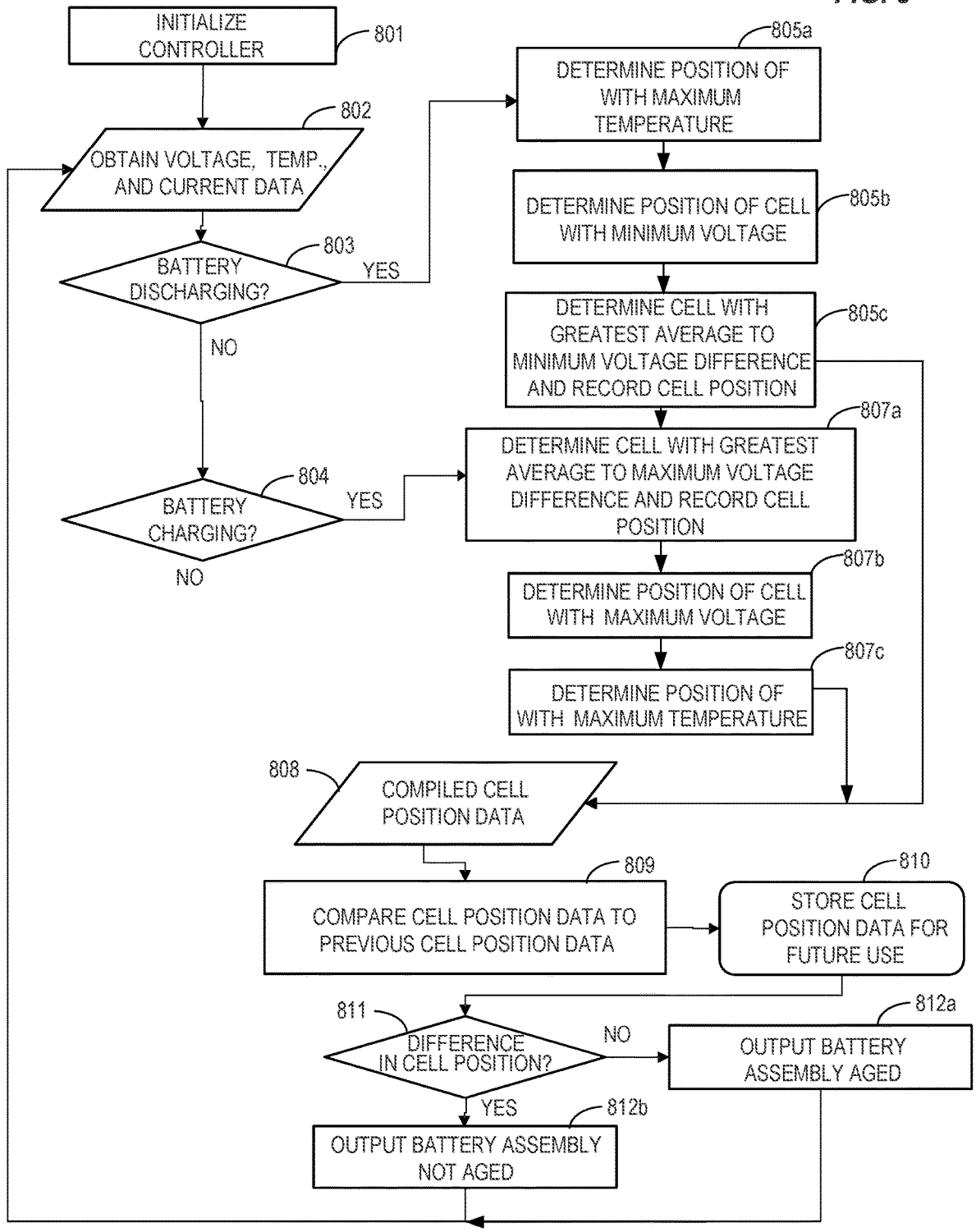
Figure 9:
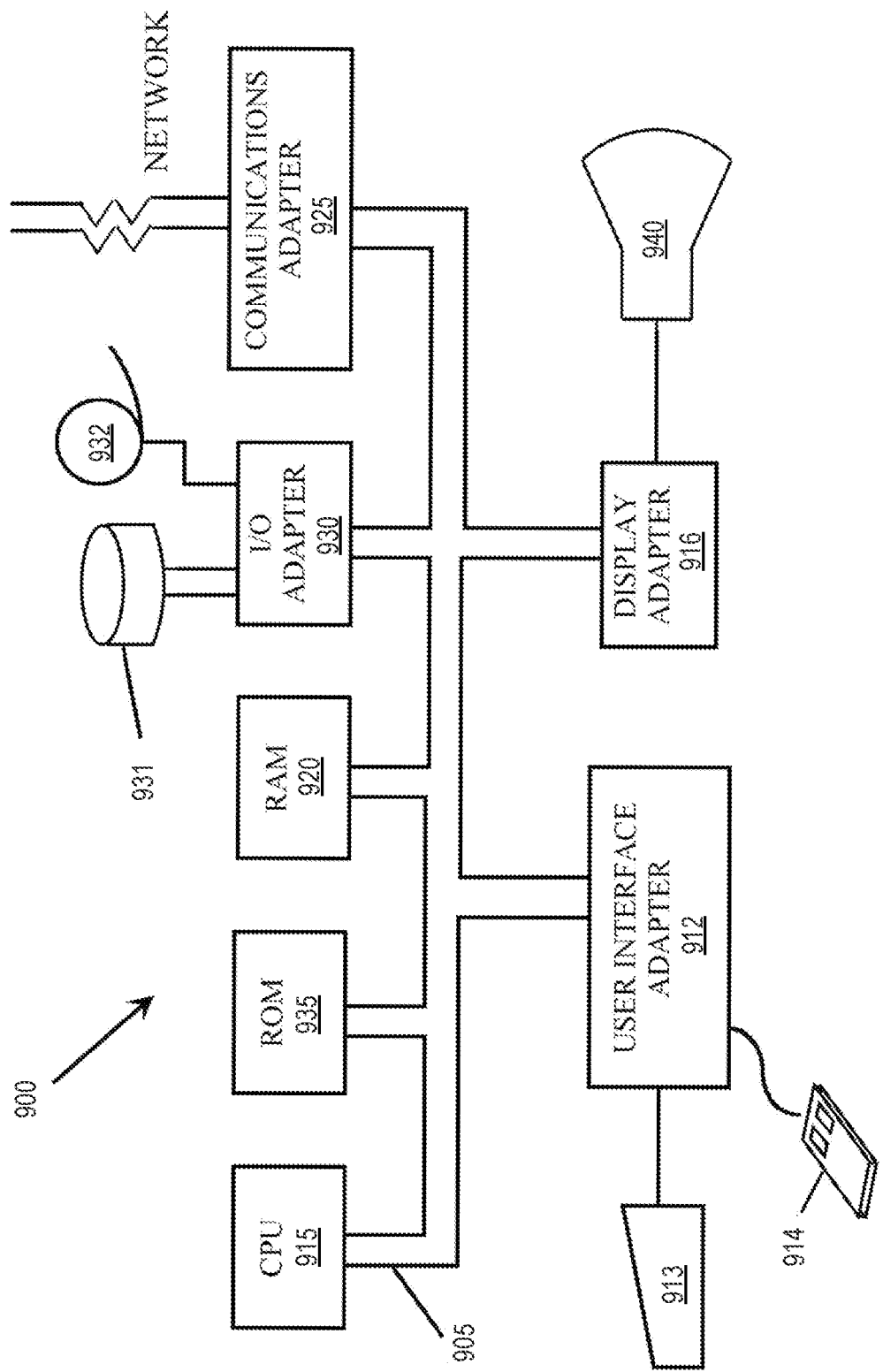
FIG. 9 illustrates a data processing system configured in accordance with embodiments of the present disclosure.

The power control system 200 includes a controller 202 (which may be implemented as a microcontroller or any other data processing system as further described with respect to FIG. 9 ("controller 202")) that collects and processes/manipulates/optimizes the data (as further described with respect to FIGS. 4-8) digitally transferred to it by the AFE 201, the temperatures sensors 206, and the current sensor 211. The power control system 200 further includes one or more digitally programmable voltage sources ("DPVS's") 205, a Fuel Gauge IC 203 (which may also be referred to herein as simply a "Fuel Gauge 203"), and a current sensor 211 for providing battery charge and discharge current (e.g., any commercially available low value current sense resistor may be utilized, or a current sensor implemented within the AFE 201 may be utilized if available). In accordance with certain embodiments of the present disclosure, when a current sensor 211 is coupled to the Fuel Gauge 203, the sensed currents that are stored in a register within the Fuel Gauge 203 may be sent to the controller 202 by the Fuel Gauge 203 via the signal lines/data buses 270, 260 to the Data In input of the controller 202.

Figure 1:
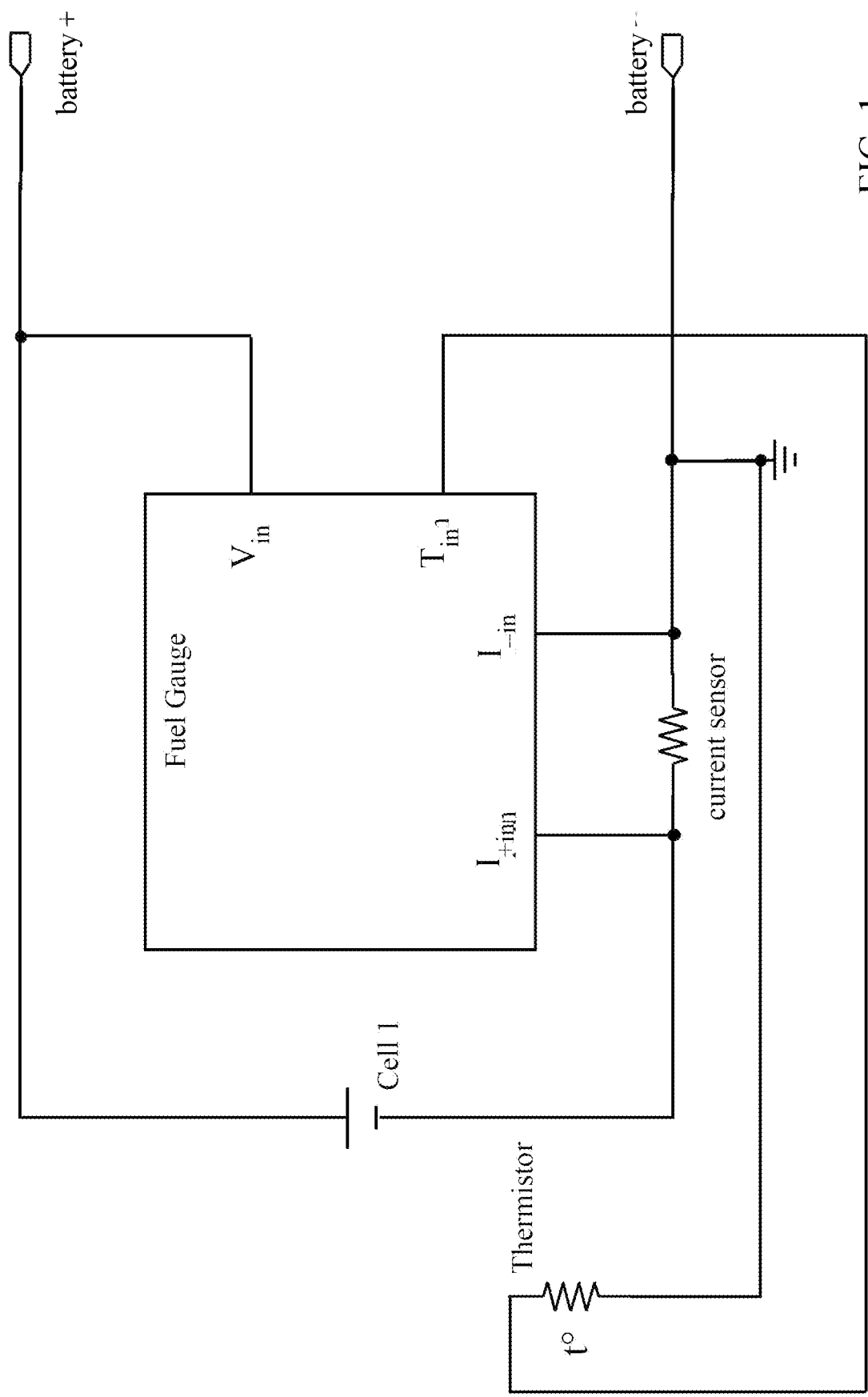
FIG. 1 illustrates a block diagram of a prior art single cell fuel gauge IC connection scheme.

The Fuel Gauge 203 may be any suitable commercially available fuel gauge circuit or device, including, but not limited to, the one described with respect to FIG. 1. In accordance with certain embodiments of the present disclosure, the Fuel Gauge 203 may contain a single analog input each for measurement of terminal voltage from a single battery cell and a voltage corresponding to a single temperature sensor corresponding to a measured temperature of that single battery cell (e.g., often using an inexpensive thermistor).

Embodiments of the present disclosure are configured to operate with the AFE 201 directly measuring voltage parameters from each individual battery cell (e.g., Cell 1 . . . Cell n, where n is a positive integer) in a battery assembly 204. Within embodiments of the present disclosure, n is greater than 1, and may be greater than 4. The AFE 201 then digitally communicates its cell-by-cell voltage measurements to the controller 202 (e.g., through a digital communications protocol such as $I^2C$, UART, SMB, or some other digital data communication scheme) over a signal line/data bus 260.

As will be further described with respect to FIGS. 4-8, the controller 202 contains one or more algorithms pre-programmed as desired to process/manipulate/optimize the incoming cell voltage measurements, temperature measurements, and/or current measurements in order to prepare this data for presentation to the Fuel Gauge 203. As will be further described with respect to FIGS. 4-8, the processed/manipulated/optimized data may be a single instantaneous measurement of the highest or lowest battery cell voltage or temperature in the battery assembly 204, average measurement, minimum measurement, maximum measurement, or any other derived representation of voltage, temperature, or other parameter, selected based on battery condition, instantaneous operating point, and/or state of health. Processed/manipulated/optimized data presented to the Fuel Gauge 203 may be different during different operating states of the battery assembly 204, such as resting, charging, or discharging.

Because the inputs of inexpensive Fuel Gauge ICs are exclusively analog in nature, the controller 202 forwards the processed/manipulated/optimized data pertaining to battery cell voltage(s) and voltage(s) corresponding to temperature information in digital form to one or more DPVS's 205, which convert the digital data to analog representations of battery cell voltage and voltage corresponding to temperature, respectively. The analog output (e.g., $V_{out1}$, $V_{out2}$) of each DPVS 205 is coupled to each analog input (e.g., $V_{in}$, $T_{in}$) of the Fuel Gauge 203.

A DPVS 205 may be configured as a digital-to-analog converter ("DAC"), a pulse width modulated ("PWM") controlled voltage source, or any other suitable type of digitally programmable voltage source that has a programmable and relatively stable analog voltage output. Different types of DPVS 205 could be used in the system 200 (for example, a DAC for voltage and a PWM for voltage corresponding to temperature). A DPVS 205 may be configured so that its output has a low periodic and random deviation (i.e., low noise), a low voltage deviation or drift, a voltage set point precision of +/−1 mV, and/or fast response and settling times to changes in programmed output voltage levels.

The one or more DPVS's 205 may be configured as a functional block implemented within the controller 202, or may be a separate module implemented outside of the controller 202 and coupled to the controller 202 by a digital communication bus, such as depicted in FIG. 2.

The Fuel Gauge 203 may have one or more digital outputs (e.g., the data bus 270), and may include a special purpose general purpose input/output ("GPIO") pin and/or analog outputs for system control. In accordance with certain embodiments of the present disclosure, the internal control and fuel gauging algorithms that are pre-programmed by the fuel gauge manufacturer and exist in the Fuel Gauge 203 for use with a single battery cell are unmodified. The fuel gauge algorithm(s), although unmodified, may be configured in the system 200 in accordance with embodiments of the present disclosure, to function in a multi-cell environment (e.g., the system 200) as a result of the presentation at the inputs (e.g., $V_{in}$, $T_{in}$) to the Fuel Gauge 203 of processed/manipulated/optimized values for analog cell voltage and voltage corresponding to temperature, which are selected or otherwise derived by the controller 202 from the data aggregated from any number of the n series-connected cells as described herein. A digital output 270 of the Fuel Gauge 203 may be configured to return a package of data or commands back to the controller 202, which may store and/or process this data and/or may utilize it for control of the battery assembly 204 or for presentation of status information or warning messages to an outside device or user (e.g., see FIG. 3). The digital output communications from the Fuel Gauge 203 to the controller 202 (e.g., via a data bus 270), and from the controller 202 to an external device or user (e.g., via a data bus 280) may be sent through I²C, UART, SMB, or any other suitable digital data communication protocol. The digital data may be configured in accordance with embodiments of the present disclosure to contain commands directed to an outside system or user (e.g., see FIG. 3) to control battery charging (e.g., to connect or disconnect a battery charger) or battery discharging (e.g., to turn on or off a power load) in response to the signals produced by the Fuel Gauge 203 as a function of the various embodiments described herein (including, but not limited to the algorithms described with respect to FIGS. 4-8). For example, the digital data may contain information related to the state of charge, state of health, or other fuel gauge parameters intended to indicate the current status of the battery assembly 204, though the present disclosure is not intended to be limited to only these forms of information.

The system 200 may be configured so that one or more temperatures within the vicinity of one or more battery cells in the battery assembly 204 is measured using any number of N (where N≥1) thermocouples or thermistors 206 located at different physical locations in proximity to selected battery cells within the battery assembly 204, which output their results to one or more inputs (e.g., $T_{in1}$, $T_{in2}$, ... $T_{in3}$) of the controller 202. In accordance with certain embodiments of the present disclosure, the system 200 may be configured so that there is at least one temperature sensor 206 for each of the battery cells within the battery assembly 204. If not, then the system 200 may be configured so that the controller is programmed with which battery cells are adjacent or in proximity to each of the temperature sensors 206. The controller 202 may be configured to compare the individual temperatures and select a minimum, maximum, average, or any other representation of temperature for presentation to the Fuel Gauge 203 depending on the state of the battery assembly 204. For example, a maximum measured temperature (e.g., occurring during a specified time period) could be used for temperature correction in the calculations performed within the Fuel Gauge 203 during a discharge, the average measured temperature (e.g., occurring during a specified time period) could be used in the calculations performed within the Fuel Gauge 203 during charging, or data from damaged or non-working thermistors 206 could be discarded from the calculations by the controller 202, thus improving the fault tolerance of the system 200. Voltages from any of the n individual battery cells measured by the AFE 201 may be handled similarly. In accordance with alternative embodiments of the present disclosure, the outputs of each of the temperature sensors 206 may be coupled to the AFE 201. The position of each temperature sensor 206 relative to the other temperature sensors 206 and the measurement of the temperature corresponding to that temperature sensor 206 may be assigned to a unique specific channel in the AFE 201. In accordance with certain embodiments of the present disclosure, the Fuel Gauge 203 may contain a single analog input each for measurement of voltage corresponding to battery cell temperature.

Figure 4:
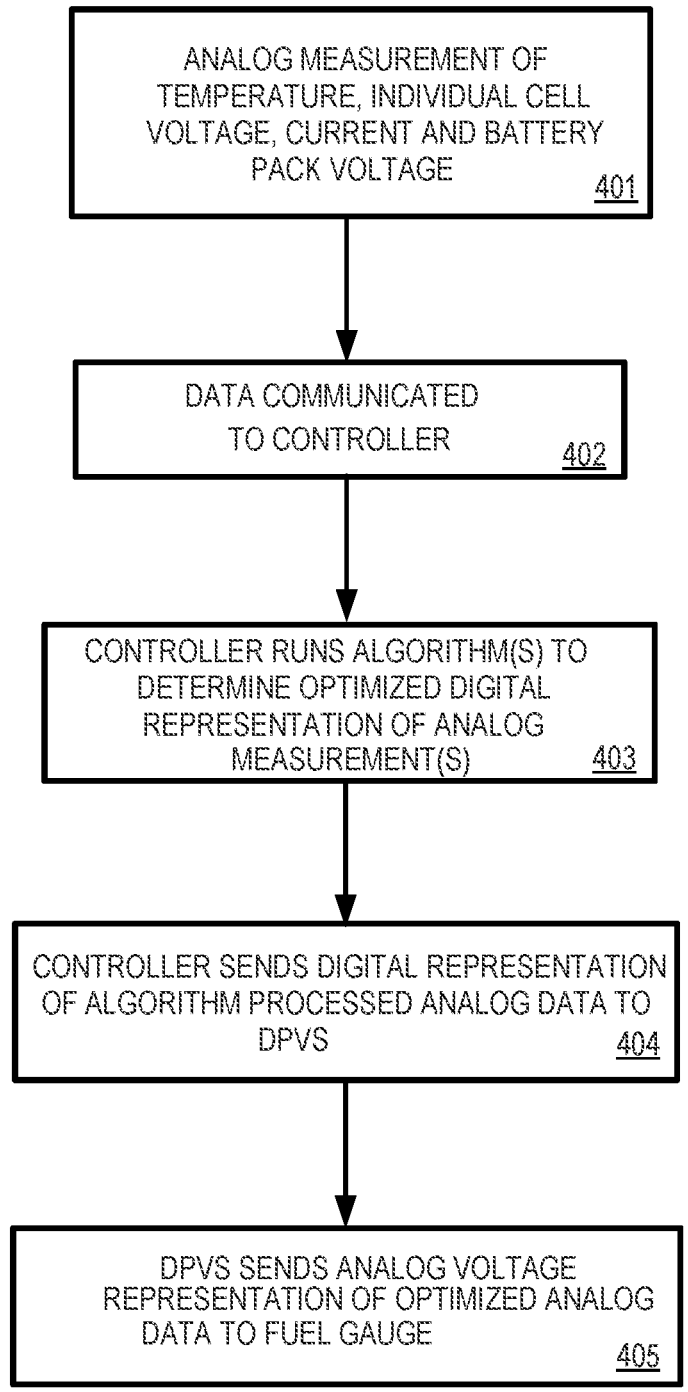
FIG. 4 illustrates a flowchart diagram configured in accordance with embodiments of the present disclosure.

As further described with respect to FIG. 4, once the battery cell voltages and/or temperatures have been collected and processed/manipulated/optimized by one or more algorithms within the controller 202, the controller 202 is then configured to deliver/transmit the processed/manipulated/optimized digital representation(s) of battery cell voltage and/or voltage corresponding to temperature to the one or more DPVS's 205. The one or more DPVS's 205 then convert the digital representations of battery cell voltage and/or voltage corresponding to temperature to their analog equivalents and delivers/transmits these analog equivalents to the analog inputs of the Fuel Gauge 203. The Fuel Gauge 203 accepts the analog inputs for voltage and/or voltage corresponding to temperature and presents these as inputs for use by its internal algorithms. The controller 202 may be configured (e.g., pre-programmed) to ensuring the one or more DPVS's 205 are continuously fed with data that is processed/manipulated/optimized.

Figure 3:
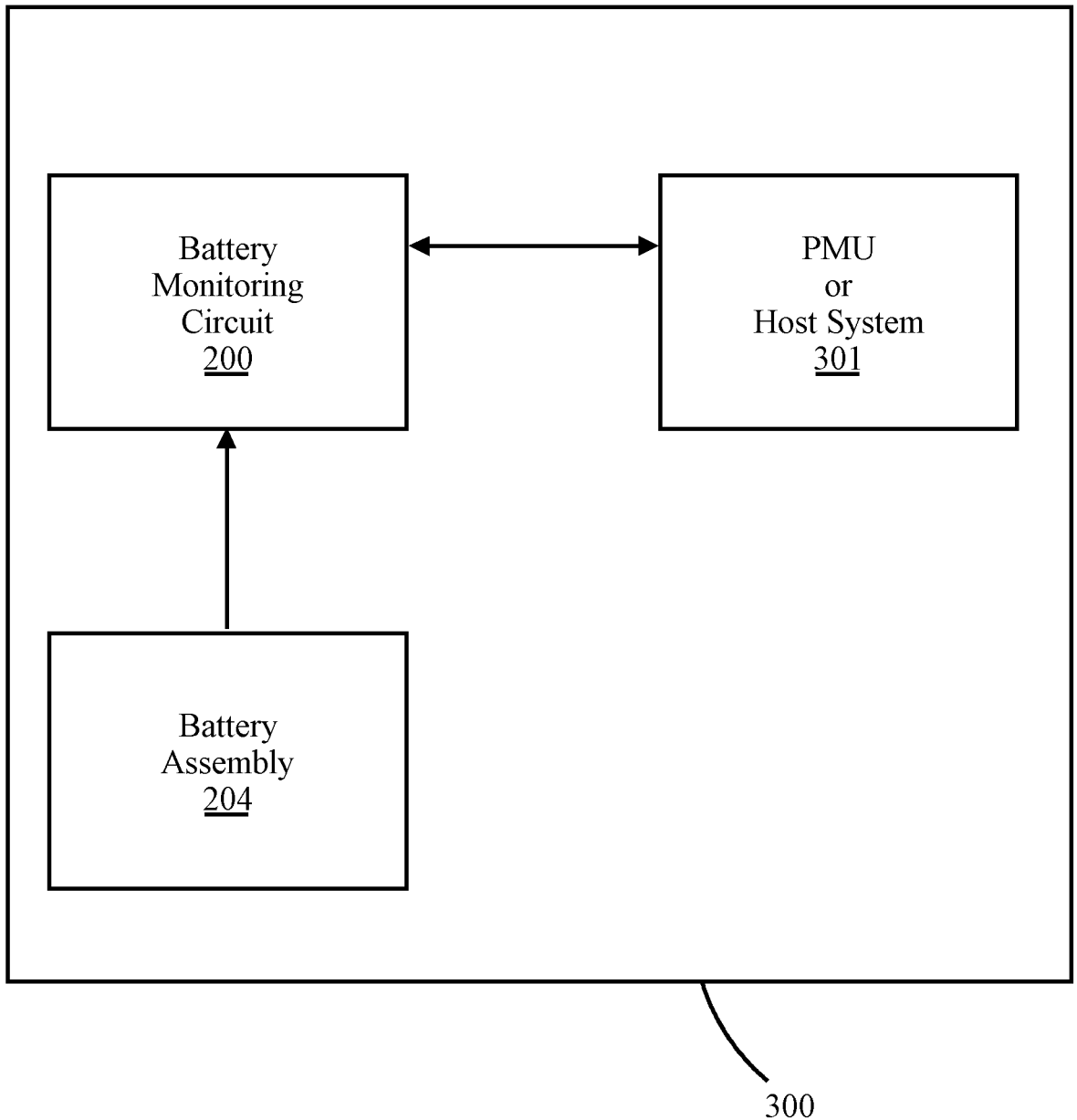
FIG. 3 illustrates an example of an apparatus configured in accordance with embodiments of the present disclosure.

FIG. 3 illustrates an apparatus 300 that may be configured with embodiments of the present disclosure. The apparatus 300 may be any device that utilizes a multi-cell battery assembly 204 for internal power. Such an apparatus 300 may be a rack of computer systems, an ebike, an electric motorcycle, an electric vehicle, a hybrid vehicle, etc. Within exemplary embodiments of the present disclosure, the power control system 200, which is coupled to the battery assembly 204 as illustrated in FIG. 2, may be in electronic communication (e.g., via the data bus 280) with a power management unit ("PMU"), or any other host system 301, such as a computer display, computer system, or any other suitable device.

Within embodiments of the present disclosure, control programs implementing one or more algorithms pre-programmed into the controller 202 (e.g., for implementing the various functionalities disclosed herein such as described with respect to FIGS. 4-8) may be input into the controller 202 through the data bus 280 coupling the controller 202 to the PMU or host system 301. Furthermore, data outputs from the Fuel Gauge 203, which may be transmitted to the controller 202 via the signal line 270, may then be forwarded to the PMU or host system 301 by the controller 202 via the data bus 280.

FIG. 4 illustrates a flowchart diagram configured in accordance with embodiments of the present disclosure representing non-limiting examples of how control algorithms may be pre-programmed into the controller 202. In the process block 401, analog measurements may be taken using the AFE 201 of individual battery cell voltages (along with the relative position of each battery cell within the battery assembly 204 associated with each of the measured battery cell voltages), and current passing through the battery cells of the battery assembly 204 (when a current sensor similar to the current sensor 211 is implemented within the AFE 201). In the process block 402, the AFE 201 then digitally communicates these measurements to the controller 202 (e.g., through a digital communications protocol such as I²C, UART, SMB, or some other digital data communication scheme) over a signal line/data bus 260. In the process block 403, the controller 202 performs the running of one or more algorithms to determine a processed/manipulated/optimized representation of the analog measurements. In the process block 404, the controller 202 delivers to the DPVS 205 the processed/manipulated/optimized representation of the analog measurements that has been processed by the one or more algorithms performed in the process block 403. In the process block 405, the DPVS 205 delivers an analog voltage representation of the processed/manipulated/optimized representation of the analog measurements to the fuel gauge 203.

In high cell count battery assemblies, there may be a slight but measurable mismatch in capacity across the different battery cells in the battery assembly 204. This means that during a discharge event of the battery assembly 204, one (or more) of the n battery cells will run out of energy before the remaining other battery cells, which can force a premature shortening of the time duration for discharging of the battery assembly 204. Sometimes this shortened discharge time duration can be significant, especially if one or more of the battery cells have experienced aging effects due to operating under high temperatures and/or repetitive charge/discharge cycling. In a battery assembly having greater than 4 series-connected battery cells, typical fuel gauge ICs would only be able to monitor a single battery cell (1S gauges) or a small portion of the total cell stack (4S gauges), and would not be able to detect a voltage of any battery cell that is not directly connected to it and thus outside of its measurement domain.

By individually monitoring voltages of all of the n battery cells via the AFE 201 and implementing one or more algorithms as described with respect to FIGS. 4-8, the controller 202 can be configured to produce the processed/manipulated/optimized data for delivery to the Fuel Gauge 203 so that there is a reduction in error in calculating battery capacity by the Fuel Gauge algorithms that determine battery capacity, and consequently the resulting state of charge and remaining capacity estimates calculated and reported by the Fuel Gauge 203.

Each individual battery cell in a plurality of battery cells will have minor differences in chemical capacity due to manufacturing tolerances. As previously described, a battery cell with reduced capacity compared to another battery cell in the plurality of battery cells will run out of energy sooner considering that all battery cell in the plurality of battery cells when connected in series are subject to the exact same discharge conditions. A battery cell with lower capacity may have a reduced terminal voltage compared to a battery cell with higher capacity. There exists a range of individual battery cell voltages within the plurality of battery cells in a battery assembly 204. This range of voltage data will have a minimum, maximum, average voltage, and other mathematical and statistical representations of these voltage measurements. Algorithms configured in accordance with embodiments of the present invention perform processing of this range of voltage data to produce the processed/manipulated/optimized data for delivery to the Fuel Gauge 203 so that there is an increase in performance of the battery assembly 204. The voltage and capacity variance in a series-connected plurality of battery cells should be less than 5 percent, preferably less than 1 percent. The greater the difference in battery capacity between the individual battery cells in a plurality of battery cells, the greater the error in estimating capacity of the full battery system by the Fuel Gauge 203 because the error is increased when the battery capacity measurements performed within the Fuel Gauge 203 are based on just the average voltage of a plurality of battery cells and not the voltages of the individual battery cells.

In accordance with embodiments of the present disclosure, the algorithms described with respect to FIGS. 5-8 reduce the error in calculating the actual usable capacity of a battery assembly within a plurality of series-connected cells based on selections of specific, individual battery cell voltages and/or temperature measurements isolated from a plurality of battery cell voltages and/or temperature measurements. The system 200 is configured to collect individual battery cell and temperature data from a plurality of battery cells and temperature sensors using the AFE 201. The AFE 201 digitally transfers this data to the controller 202, which is configured with the one or more algorithms to process the data to determine and/or calculate various parameters, assign that data to a battery cell position or temperature sensor position, and then make determinations, based on if a battery is charging or discharging, on when to use a particular parameter, calculated parameter, or other processed representation of the data to be presented to the Fuel Gauge 203 to reduce error in calculation of battery capacity based parameters.

In addition, certain fuel gauges, such as the Impedance Track fuel gauges commercially available from Texas Instruments, create an internal table of internal individual cell resistances at different states of charge during operation. This table is created by analyzing cell voltage deviation versus instantaneous current during a discharge, and correlating this to state of charge. It may be important to determine and track the battery cell with the highest impedance (resistance), as this (1) provides a better determination of aging of the entire battery assembly 204, and (2) will be a limiting factor in being able to support a high discharge current. In accordance with certain embodiments of the present disclosure, an impedance measuring algorithm implemented within the controller 202 may be configured to always be presented with the voltage data from the individual battery cell with the highest impedance so that the accuracy and usefulness of the impedance table is assured.

As will be further described with respect to FIGS. 4-8, these flow chart diagrams represent algorithms as to what processed/manipulated/optimized data to be presented by the controller 202 to the Fuel Gauge 203 that may be pre-programmed into the internal software of the controller 202 or hardwired into the circuitry of the controller 202. Non-limiting examples of such algorithms are described with respect to FIGS. 5-8.

In FIGS. 5-8, the process blocks 502, 602, 702, and 802 represent the obtaining of the voltage, temperature, and current data. In accordance with certain embodiments of the present disclosure as illustrated in FIG. 2, the voltage data pertaining to the individual battery cells and the battery assembly 204 as a whole may be communicated from the AFE 201 over the signal line/data bus 260 to the controller 202, while the temperature data from the one or more temperature sensors 206 may be communicated to the controller directly. In accordance with alternative embodiments of the present disclosure, the one or more temperature sensors 206 may have their outputs coupled to the AFE 201, which would then communicate such temperature data over the signal line/data bus 260 to the controller 202. Likewise, in accordance with alternative embodiments of the present disclosure, the AFE 201 may implement a current sensor enabling the AFE 201 to communicate such current data over the signal line/data bus 260 to the controller 202. Such alternative embodiments are well within the ordinary skill of artisans in the field. Additionally, though the process blocks 502, 602, 702, and 802 are illustrated and described as obtaining the voltage, temperature, and current data, any of these process blocks may be performed to only obtain one or more of the voltage, temperature, and current data as needed by the remainder of the algorithms described within FIGS. 5-8.

Figure 5:
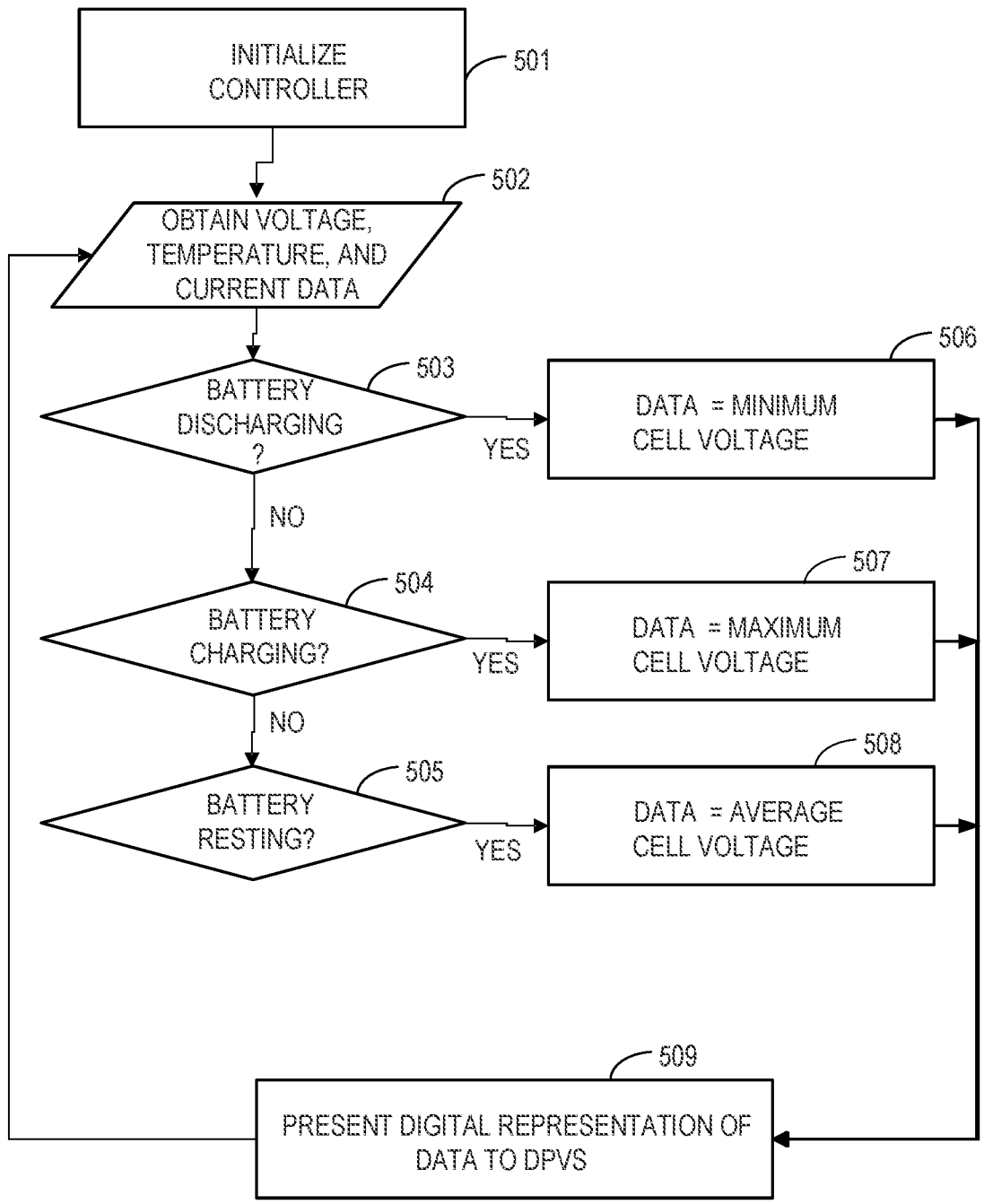
FIGS. 5, 6, 7 and 8 illustrate flowchart diagrams of exemplary processes performed in accordance with various embodiments of the present disclosure.

Referring to FIG. 5, in accordance with embodiments of the present disclosure, one or more algorithms may be pre-programmed into the controller 202 so that the controller 202 is configured to select a voltage from the AFE data provided in the process block 402 as a function of whether the battery assembly 204 is discharging, charging, or resting. Such a selected voltage can be utilized by the Fuel Gauge 203 to determine whether one or more of the battery cells within the battery assembly 204 is aging more quickly than other ones of the battery cells, which determination may be utilized by a PMU or host system 301 to account for such aging during any of the states of charging, discharging, and/or resting of the battery assembly 204.

In the process block 501, the controller 202 may be initialized. In the process block 502, voltage, temperature, and current data is obtained from the various sources within the system 200 (see also the process block 402 of FIG. 4). The AFE 201 may be configured to intermittently broadcast transfer its data to the controller 202 at a given time interval, or the controller 202 may be configured to request the AFE data when the control algorithm is ready to accept the next sample of AFE data.

In the process block 503, a determination is made by the controller 202 whether the battery assembly 204 is in a state of discharging based on the direction of current flow (e.g., as sensed by the current sensor 211). If the battery assembly 204 is determined to be in a state of discharging, in the process block 506, the controller 202 determines which of the battery cell voltages is the minimum, or lowest, voltage among the plurality of battery cells in the battery assembly 204. In the process block 509, this single battery cell minimum voltage is presented to the Fuel Gauge 203 using a representative voltage delivered by the controller 202 to the DPVS 205. Note that the identification of the battery cell having the minimum, or lowest, voltage (e.g., the position of the battery cell relative to the other battery cells in the battery assembly 204) may also be determined in conjunction with determining the minimum, or lowest, voltage by utilizing another algorithm within the controller 202, such as described with respect to FIG. 8.

The minimum battery cell voltage can represent the single battery cell with reduced capacity or increased impedance compared to the other battery cells in the battery assembly 204, and thus could represent the battery cell with the most significantly degraded electrical performance of all the battery cells in the battery assembly 204. The performance of the Fuel Gauge 203 with respect to this particular battery assembly 204 may then be based on the lowest voltage, representing the lowest capacity and therefore weakest single battery cell in the plurality of battery cells in the battery assembly 204. For example, the weakest battery cell having a reduced capacity may possess a reduced terminal voltage at a given discharge current. This reduced terminal voltage can also be a function of increased Direct Current Internal Resistance ("DCIR"), which is substantially the same as cell resistance or cell impedance. DCIR increases as battery cells age due to the changes in chemical and physical structure of the anode, cathode, and electrolyte composition within a battery cell. The rate of aging may be different between the individual battery cells within a plurality of battery cells, and therefore individual battery cells within a plurality of battery cells may have different DCIR values. For a given current load on a battery cell, the greater its DCIR, the lower the terminal voltage it then possesses to supply that current to a load. As battery cells within a plurality of battery cells age at different rates, that will further increase the range of voltages measured among the various battery cells resulting in a greater separation between the minimum voltage supplied by one of the particular battery cells and the maximum voltage supplied by another one of the battery cells in a battery assembly 204.

For example, during discharging of the battery assembly 204, the such a measured minimum battery cell voltage of all of the n battery cells can be used by the Fuel Gauge 203 to more accurately predict the currently available battery cell capacity, the end of discharge threshold, and the overall health of the battery assembly than is possible using current fuel gauge technology (see FIG. 1) without the use of the embodiments of the present disclosure. As described herein with respect to the process blocks 503, 506, and 509, embodiments of the present disclosure are configured to provide such a minimum battery cell voltage from among a plurality of battery cells, which is not possible with current fuel gauge technology.

Note that though FIG. 5 shows that the single battery cell minimum representative voltage is presented to the Fuel Gauge 203 during periods of discharging, in accordance with alternative embodiments of the present disclosure, the controller 202 may be configured to select the single battery cell minimum representative voltage for presentation to the Fuel Gauge 203 during periods of charging or resting.

If in the process block 503 a determination is made by the controller 202 that the battery assembly 204 is not in a state of discharging, the controller 202 may determine if the battery assembly 204 is in a state of charging in the process block 504 based on the direction of current flow (e.g., as sensed by the current sensor 211). If the battery assembly 204 is determined to be in a state of charging, in the process block 507, the controller 202 determines which of the battery cell voltages is the maximum, or highest, voltage among the plurality of battery cells in the battery assembly 204. In the process block 509, this single battery cell maximum voltage is presented to the Fuel Gauge 203 using a representative voltage delivered by the controller 202 to the DPVS 205. Note that the identification of the battery cell having the maximum, or highest, voltage (e.g., the position of the battery cell relative to the other battery cells in the battery assembly 204) may also be determined in conjunction with determining of the maximum, or highest, voltage by utilizing another algorithm within the controller 202, such as described with respect to FIG. 8. This maximum battery cell voltage can represent the single battery cell with the greatest reduction in capacity or increased impedance compared to the other battery cells in the battery assembly 204, and thus could represent the battery cell with the minimal, or "worst," electrical or electrochemical performance among the battery cells in the battery assembly 204. The performance of the Fuel Gauge 203 for this particular battery assembly 204 may then be based on the weakest performing single battery cell in the plurality of cells in the battery assembly 204. For example, the weakest battery cell having a reduced capacity may possess a reduced terminal voltage at a given discharge current. This reduced terminal voltage can also be a function of increased DCIR.

For example, during charging of the battery assembly 204, such a measured maximum battery cell voltage of all of the n battery cells can be used by the Fuel Gauge 203 to more accurately predict the currently available battery cell capacity, the end of charge threshold, and the overall health of the battery assembly than is possible using current fuel gauge technology (see FIG. 1). As described herein with respect to the process blocks 504, 507, and 509, embodiments of the present disclosure are configured to provide such a maximum battery cell voltage from among a plurality of battery cells, which is not possible with current fuel gauge technology.

Note that though FIG. 5 shows that the single battery cell maximum representative voltage is presented to the Fuel Gauge 203 during periods of charging, in accordance with alternative embodiments of the present disclosure, the controller 202 may be configured to select the single battery cell maximum representative voltage for presentation to the Fuel Gauge 203 during periods of discharging or resting.

If in the process block 504 a determination is made by the controller 202 that the battery assembly 204 is not in a state of charging, the controller 202 may determine if the battery assembly 204 is in a state of resting in the process block 505. When the battery assembly 204 is at rest, there is no current flowing (e.g., as sensed by the current sensor 211) into or out of the battery assembly 204. If the battery assembly 204 is determined to be in a state of resting, in the process block 508, the controller 202 determines the average battery cell voltage within the battery assembly 204 (or such an average battery cell voltage may simply be selected from the data received from the AFE 201 if this parameter has already been determined within the AFE 201). In the process block 509, this average battery cell voltage is presented to the Fuel Gauge 203 using a representative voltage delivered by the controller 202 to the DPVS 205.

During resting of the battery assembly 204, the average battery cell voltage of all of the n battery cells may be utilized by the Fuel Gauge 203 to provide a more accurate estimate of state of charge of the entire battery assembly 204.

Note that though FIG. 5 shows that the average battery cell voltage is presented to the Fuel Gauge 203 during periods of resting, in accordance with alternative embodiments of the present disclosure, the controller 202 may be configured to select the average battery cell voltage for presentation to the Fuel Gauge 203 during periods of discharging or charging.

Please note that embodiments of the present disclosure are not limited to performance of the process blocks 503-505 in the order illustrated in FIG. 5, but may be performed in any order relative to each other. Furthermore, in accordance with embodiments of the present disclosure, any of the paired process blocks of 503/506, 504/507, and/or 505/508 may be performed in any combination. In other words, the process blocks 503 and 506 may be performed in isolation without performing the other paired process blocks 504/507 and/or 505/508. Likewise, the process blocks 504 and 507 may be performed in isolation without performing the other paired process blocks 503/506 and/or 505/508. Likewise, the process blocks 505 and 508 may be performed in isolation without performing the other paired process blocks 503/506 and/or 504/507.

Figure 6:
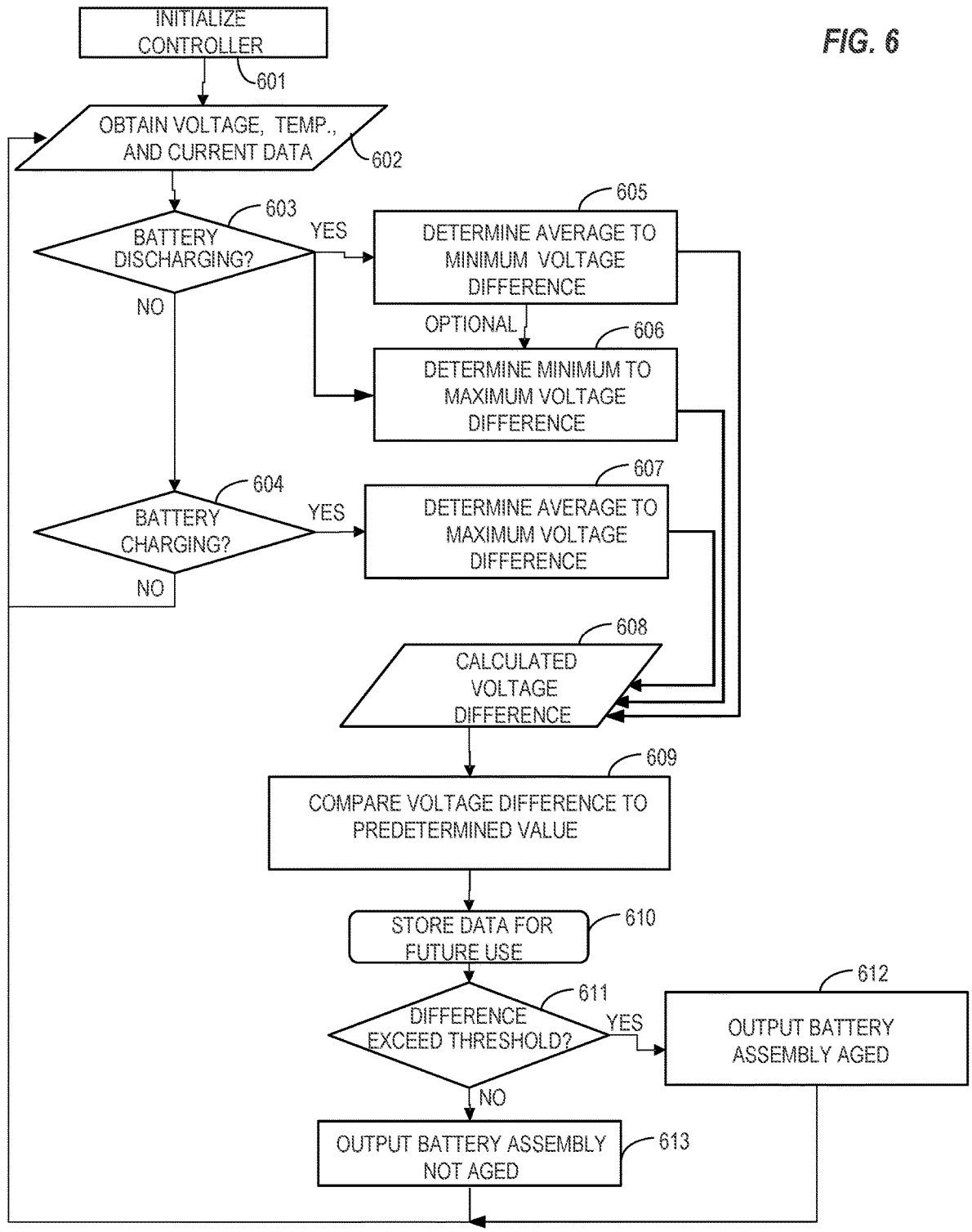

Referring to FIG. 6, in accordance with embodiments of the present disclosure, one or more algorithms may be pre-programmed into the controller 202 so that the controller 202 is configured to perform computations based on the measured battery cell voltages in the battery assembly 204 from the AFE data provided in the process block 402 in order to determine whether the battery assembly 204, or any particular battery cells within the battery assembly 204, have aged.

The determination of battery cell and/or battery assembly aging can be determined by comparing a level of performance of one or more battery cells to its performance at another time (e.g., a previous time period during its operation, or even when the battery assemble 204 was new). Such a level of performance comparison can be determined as a function of the reduction in capacity of the one or more battery cells, or as a function of an increase in DCIR of the one or more battery cells due to changes to the internal chemical structure of the anode, cathode, and/or electrolyte composition within a battery cell.

In the process block 601, the controller 202 may be initialized. In the process block 602, voltage, temperature, and current data may be obtained from the various sources within the system 200. In the process block 603, a determination may be made by the controller 202 whether the battery assembly 204 is in a state of discharging based on the direction of current flow (e.g., as sensed by the current sensor 211). If the battery assembly 204 is determined to be in a state of discharging, in the process block 605, the controller 202 may determine an average to minimum difference in voltage (also referred to herein as the "first difference"). This difference may be determined by calculating the mathematical average from the range of measured battery cell voltages received from the AFE 201, determining the minimum voltage from the measured battery cell voltages, and subtracting this minimum voltage from the average of the battery cell voltages. In accordance with certain embodiments of the present disclosure, the controller 202 may be configured to perform this determination in the process block 605 at, or near, the substantial completion of discharge of the battery assembly 204 if it is desired to utilize a maximum voltage delta between the minimum voltage and average voltage values to send to the AFE 201.

This determined value from the process block 605 may be stored in the controller 202 (see the process block 608). In the process block 609, the determined value may be compared to a predetermined value. The predetermined value may be a programmed threshold value or a value stored in memory (see the process block 608) from a previous determination by the process block 605. In the process block 610, the result of the comparison may be stored in the controller 202 for later use. In the process block 611, a determination may be made whether the difference comparison determined in the process block 609 exceeds a predetermined threshold, which can provide information about the health of the battery assembly 204. For example, such a difference comparison threshold may be predetermined to represent a reduction of capacity of the battery cell pertaining to the minimum voltage (e.g., compared to a previously determined capacity) so as to determine if the battery cell has aged (e.g., and it can no longer perform its intended function). Capacity can be measured by integrating the current over time from the point when a battery cell is fully charged until a battery cell is considered empty or substantially discharged. Capacity is most commonly reported in Amp-hours. Capacity can also be represented as total available energy using units of Watt-hours, Watt-seconds, or Joules. Typical thresholds for capacity reduction are between 60% and 80% of capacity from when the battery cell was new, though embodiments of the present disclosure are not limited to this range of percentages. In accordance with certain embodiments of the present disclosure, the controller 202 may be configured to obtain a measurement of the capacity of the battery assembly 204 at some time period (e.g., when the battery assembly 204 is relatively new) and store this capacity value as a threshold for comparison.

For example, at a point when time has passed, the capacity of the battery assembly 204 may be calculated by the Fuel Gauge 203 (e.g., using the single representation of voltage based on the algorithms described with respect to FIGS. 5 and 6 corresponding to the lowest capacity cell limiting battery assembly performance).

For example, the determination made in the process block 611 can be utilized (e.g., by the PMU or host system 301) to predict a weak battery cell during discharge if the value determined in the process block 605 is increasing over time, since a weak battery cell with reduced capacity will discharge faster than other battery cells in the battery assembly 204. If in the process block 611, it is determined that the difference comparison exceeds the predetermined threshold, then it is determined in the process block 612 that the battery assembly 204 has aged (for example, in an unsatisfactory manner), which may be output from the controller via the data bus 280. If in the process block 611, it is determined that the difference comparison does not exceed the predetermined threshold, then it is determined in the process block 613 that the battery assembly 204 has not aged, which may be output from the controller via the data bus 280.

If the battery assembly 204 is determined to be in a state of discharging, in the process block 606, the controller 202 may determine difference between the minimum and maximum voltages (also referred to herein as the "second difference"). This difference may be determined by determining the minimum voltage from the measured battery cell voltages, determining the maximum voltage from the measured battery cell voltages, and subtracting these voltages from each other. In accordance with certain embodiments of the present disclosure, the controller 202 may be configured to perform this determination in the process block 606 at, or near, the substantial completion of discharge of the battery assembly 204 if it is desired to utilize a maximum voltage delta between the minimum and maximum voltages to send to the AFE 201.

This determined value from the process block 606 may be stored in the controller 202 (see the process block 608). In the process block 609, the determined value may be compared to a predetermined value. The predetermined value may be a programmed threshold value or a value stored in memory (see the process block 608) from a previous determination by the process block 606. In the process block 610, the result of the comparison may be stored in the controller 202 for later use. In the process block 611, a determination may be made whether the difference comparison determined in the process block 609 exceeds a predetermined threshold, which can provide information about the health of the battery assembly 204. For example, such a difference comparison threshold may be predetermined to represent a reduction of capacity of the battery cell.

For example, the determination made in the process block 611 can be utilized (e.g., by the PMU or host system 301) to predict a weak battery cell during discharge if the value determined in the process block 606 is increasing over time, since a weak battery cell with reduced capacity will discharge faster than other battery cells in the battery assembly 204. If in the process block 611, it is determined that the difference comparison exceeds the predetermined threshold, then it is determined in the process block 612 that the battery assembly 204 has aged (for example, in an unsatisfactory manner), which may be output from the controller via the data bus 280. If in the process block 611, it is determined that the difference comparison does not exceed the predetermined threshold, then it is determined in the process block 613 that the battery assembly 204 has not aged, which may be output from the controller via the data bus 280.

Note that in accordance with various embodiments of the present disclosure, the controller 202 may be configured to select which of the process blocks 605 and 606 to perform during a discharge.

If in the process block 603 a determination is made by the controller 202 that the battery assembly 204 is not in a state of discharging, the controller 202 may determine if the battery assembly 204 is in a state of charging in the process block 604 based on the direction of current flow (e.g., as sensed by the current sensor 211). If the battery assembly 204 is determined to be in a state of charging, in the process block 607, the controller 202 determines an average to maximum difference in voltage (also referred to herein as the "third difference"). This difference may be determined by calculating the mathematical average from the range of measured battery cell voltages received from the AFE 201, determining the maximum voltage from the measured battery cell voltages, and subtracting the average voltage of the battery cells from the maximum voltage. In accordance with certain embodiments of the present disclosure, the controller 202 may be configured to perform this determination in the process block 607 at, or near, the substantial completion of charging of the battery assembly 204 if it is desired to utilize a maximum voltage delta between the maximum voltage and average voltage values to send to the AFE 201.

This determined value from the process block 607 may be stored in the controller 202 (see the process block 608). In the process block 609, the determined value may be compared to a predetermined value. The predetermined value may be a programmed threshold value or a value stored in memory (see the process block 608) from a previous determination by the process block 607. In the process block 611, a determination may be made whether the difference comparison determined in the process block 609 exceeds a predetermined threshold, which can provide information about the health of the battery assembly 204 in a similar manner as previously described with respect to the determination by the process block 605. If in the process block 611, it is determined that the difference comparison exceeds the predetermined threshold, then it is determined in the process block 612 that the battery assembly 204 has aged (for example, in an unsatisfactory manner), which may be output from the controller via the data bus 280. If in the process block 611, it is determined that the difference comparison does not exceed the predetermined threshold, then it is determined in the process block 613 that the battery assembly 204 has not aged, which may be output from the controller via the data bus 280.

In accordance with certain embodiments of the present disclosure, a combination of the process blocks 605 and 606 may be performed in order to determine the difference between the minimum and maximum battery cell voltages measured by the AFE 201. In such embodiments, the process blocks 605 and 606 may be performed by the controller 202 in succession or substantially concurrently, and then their determinations combined to produce the difference between the minimum and maximum battery cell voltages. In accordance with certain embodiments of the present disclosure, the controller 202 may be configured to perform this determination in the process blocks 605 and 606 at, or near, the substantial completion of discharge of the battery assembly 204 if it is desired to utilize a maximum voltage delta between the minimum and maximum battery cell voltages to send to the AFE 201.

This determined value from the process blocks 605 and 606 may be stored in the controller 202 (see the process block 608). In the process block 609, the determined value may be compared to a predetermined value. The predetermined value may be a programmed threshold value or a value stored in memory (see the process block 608) from a previous determination by the process blocks 605 and 606. In the process block 610, the result of the comparison may be stored in the controller 202 for later use. In the process block 611, a determination may be made whether the difference comparison determined in the process block 609 exceeds a predetermined threshold, which can provide information about the health of the battery assembly 204 in a similar manner as previously described with respect to the determination by the process block 605.

If in the process block 611, it is determined that the difference comparison exceeds the predetermined threshold, then it is determined in the process block 612 that the battery assembly 204 has aged (for example, in an unsatisfactory manner), which may be output from the controller via the data bus 280. If in the process block 611, it is determined that the difference comparison does not exceed the predetermined threshold, then it is determined in the process block 613 that the battery assembly 204 has not aged, which may be output from the controller via the data bus 280.

In accordance with certain embodiments of the present disclosure, a combination of the process blocks 605 and 606 may be performed in order to determine a DCIR value for a particular battery cell within the battery assembly 204. The greater the determined DCIR increase, the closer that battery cell in the battery assembly 204 is to its determination threshold for aging. Consequently, the battery assembly 204 is thus in a lower state of health.

DCIR values may be calculated by measuring the voltage drop at a given, near instantaneous step change in load. DCIR is typically represented using the units of milliohms. DCIR may be calculated using the function: $DCIR=(V_i-V_0)/(I_i-I_0)$ where $V_0$ and $I_0$ are the initial voltage and current measurements, respectively, and $V_i$ and $I_i$ are the instantaneous voltage and current measurements, respectively, taken at a later time. Calculation of the DCIR values may be performed by the process block 608.

In accordance with certain embodiments of the present disclosure, measurements of the initial voltage and current and measurements of the instantaneous voltage and current may at least be separated by a small time gap (e.g., less than 10 seconds) to allow the battery terminal voltage to stabilize but not begin to decrease due to energy depletion. In accordance with certain embodiments of the present disclosure, the controller 202 may be configured to calculate and store DCIR values when the battery assembly is relatively new to use as at least the initial comparison thresholds. The current values could be provided to the controller 202 as described herein. Typical thresholds for DCIR increase are between 150% and 200% of DCIR when new.

In the process block 609, a newly determined DCIR value (i.e., based on measurements of the instantaneous voltage and current) may be compared to a previously calculated DCIR value. In the process block 610, the result of the comparison may be stored in the controller 202 for later use. In the process block 611, a determination may be made whether the difference comparison determined in the process block 609 exceeds a predetermined DCIR increase threshold, which can provide information about the health of the battery assembly 204.

If in the process block 611, it is determined that the difference comparison exceeds the predetermined threshold, then it is determined in the process block 612 that the battery assembly 204 has aged (for example, in an unsatisfactory manner), which may be output from the controller via the data bus 280. If in the process block 611, it is determined that the difference comparison does not exceed the predetermined threshold, then it is determined in the process block 613 that the battery assembly 204 has not aged, which may be output from the controller via the data bus 280.

As can be readily appreciated, performance of various combinations of the process blocks 603-613 enables the controller to be configured to determine whether the multi-cell battery assembly has aged beyond a predetermined threshold as a function of a change in any one or more of the first, second, and third differences over time.

Please note that embodiments of the present disclosure are not limited to performance of the process blocks 603-604 in the order illustrated in FIG. 6, but may be performed in any order relative to each other, or may be performed in isolation without performing the other process block. In other words, any of the previously described combinations of the process blocks 603-606 may be performed in isolation without performing the process blocks 604 and 607. Likewise, the process blocks 604 and 607 may be performed in isolation without performing the other process blocks 603-606.

Figure 7:
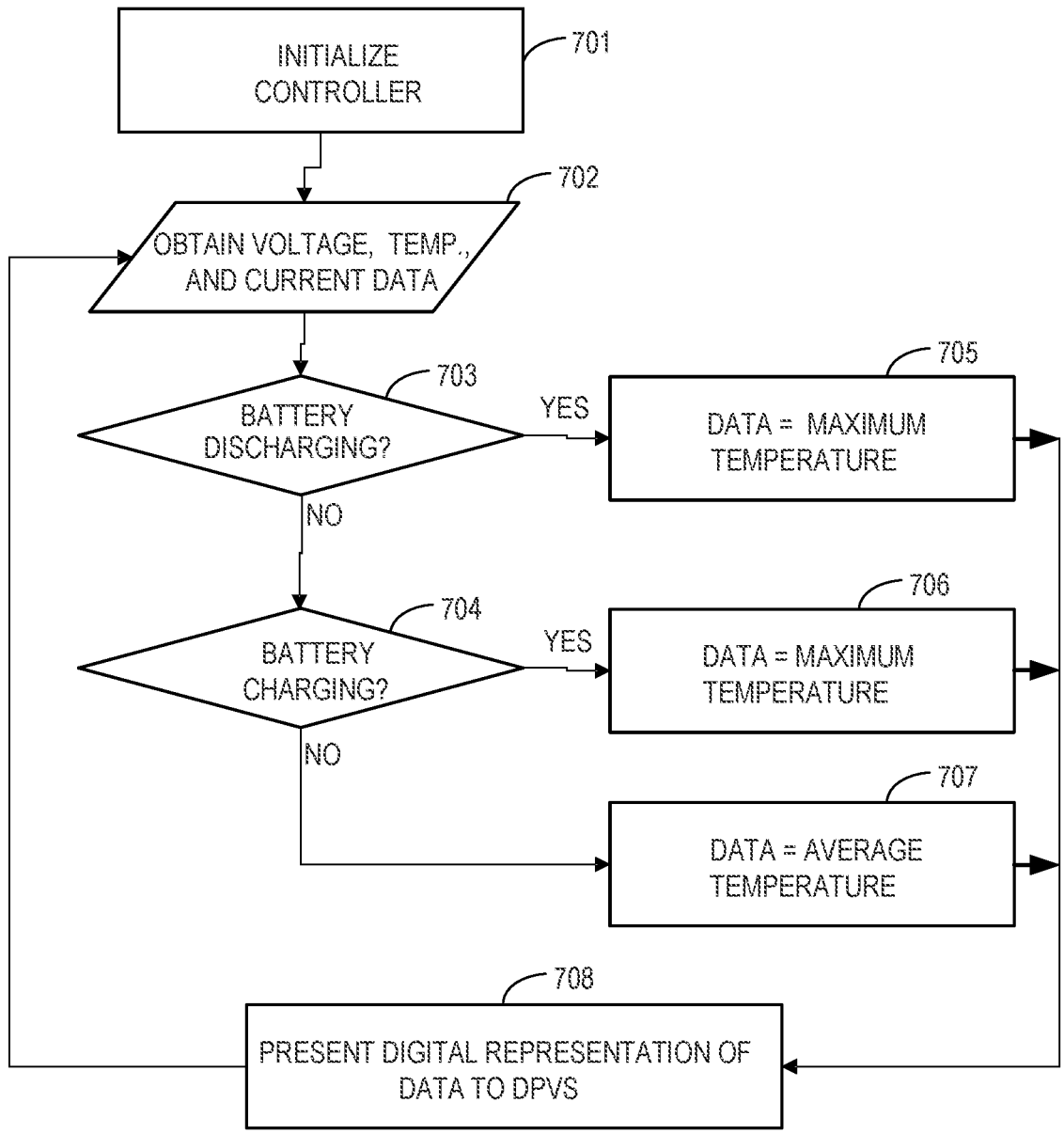

Referring to FIG. 7, in accordance with embodiments of the present disclosure, one or more algorithms may be pre-programmed into the controller 202 so that the controller 202 is configured to select the temperature from the sensor of the one or more temperature sensors 206 (e.g., thermocouples or thermistors) that has the highest, or lowest, temperature relative to the other temperature sensors (or an average temperature of the sensors may be determined). It may be important to track one or more temperatures measured within a battery assembly 204, sinc increased temperature is an acceleration factor to the degradation of the chemical composition of the anode, cathode, and electrolyte formulations in a battery cell. This temperature-based accelerated degradation mechanism reduces chemical capacity and increases DCIR, therefore reducing the health of a battery.

As illustrated in FIG. 2, the temperature sensors may be coupled directly to the controller 202, or the temperatures may be derived from the AFE data. A battery assembly containing a plurality of battery cells with typically greater than 4 battery cells will have a plurality of temperature sensors (e.g., two or more temperature sensors). Or, there may be one temperature sensor implemented for each n (e.g., where n≥3) number of battery cells in a battery assembly. Consequently, there may exist a range in measured temperatures based on the position of each of the temperature sensors relative to the various battery cells in the battery assembly. The temperature values in the range can be processed by the controller 202 to calculate the mathematical maximum, minimum, and average temperature values in the battery assembly 204. Additional mathematical operations can be performed by the controller 202 to calculate differences between these maximum, minimum, and average temperature values in the battery assembly 204. The variation in the range of temperature sensor measurement data can be determined by such parameters as the position of the sensor within the housing of the battery assembly, the amount of airflow through a battery assembly, and the state of health of the individual battery cells in the battery assembly. For example, as heat rises, temperature sensors located at a greater relative height within the battery assembly may show higher temperature readings indicating a battery cell has a greater temperature than an adjacent battery cell. A battery cell or cells may measure a higher temperature if they are located at a position with reduced airflow in the battery assembly. For example, a battery cell positioned closer to the outlet end of the airflow may have a higher temperature than a battery cell located near the inlet end of the battery assembly due to temperature gradients from air inlet to air outlet in the battery assembly.

In the process block 701, the controller 202 may be initialized. In the process block 702, voltage, temperature, and current data may be obtained from the various sources within the system 200. In the process block 703, a determination may be made by the controller 202 whether the battery assembly 204 is in a state of discharging. If the battery assembly 204 is determined to be in a state of discharging, in the process block 705, the controller 202 determines which of the temperature sensors 206 has the highest temperature relative to the other temperature sensors 206. In the process block 708, this highest temperature is presented to the Fuel Gauge 203 using a representative voltage delivered by the controller 202 to the DPVS 205.

During discharging of the battery assembly 204, such a determined highest temperature can represent the single battery cell or a plurality of battery cells adjacent to or in the vicinity of the temperature sensor 206 identified as having the highest temperature, and consequently having a reduced capacity or increased impedance, compared to the other battery cells in the battery assembly 204. As such, the determined highest temperature could therefore represent the single battery cell or a plurality of battery cells within the battery assembly 204 possessing the lowest physical performance among the battery cells within the battery assembly 204. For example, a battery cell with a higher internal resistance likely possesses a greater increase in its temperature due to power loss at a given current input.

If in the process block 703 a determination is made by the controller 202 that the battery assembly 204 is not in a state of discharging, the controller 202 may determine if the battery assembly 204 is in a state of charging in the process block 704. If the battery assembly 204 is determined to be in a state of charging, in the process block 706, the controller 202 determines which of the temperature sensors 206 has the highest temperature relative to the other temperature sensors 206. In the process block 708, this highest temperature is presented to the Fuel Gauge 203 using a representative voltage delivered by the controller 202 to the DPVS 205.

During charging of the battery assembly 204, such a determined highest temperature can represent the single battery cell or a plurality of battery cells adjacent to or in the vicinity of the temperature sensor 206 identified as having the highest temperature, and consequently having a reduced capacity or increased impedance, compared to the other battery cells in the battery assembly 204. As such, the determined highest temperature could therefore represent the single battery cell or a plurality of battery cells possessing the lowest physical performance or having a reduced airflow around such one or more battery cells. A battery cell with a higher internal resistance would have a greater temperature rise due to power loss at a given current input. The highest cell temperature can be an important safety indicator to prevent over temperature conditions during high-rate discharges or when the battery assembly 204 is used in high ambient temperature environments.

If in the process block 704 a determination is made by the controller 202 that the battery assembly 204 is not in a state of charging or discharging, the controller 202 may determine that the battery assembly 204 is in a state of rest. If the battery assembly 204 is determined to be in a state of rest, in the process block 707, the controller 202 determines the average temperature of the temperature sensors 206. In the process block 708, this average temperature is presented to the Fuel Gauge 203 using a representative voltage delivered by the controller 202 to the DPVS 205.

Referring to FIG. 8, in accordance with embodiments of the present disclosure, one or more algorithms may be pre-programmed into the controller 202 so that the controller 202 is configured to track the position of one or more of the battery cells within the battery assembly 204 meeting any one or more of the conditions described with respect to FIGS. 5-7. Thus, such one or more algorithms may be performed in combination with any of the one or more algorithms described with respect to FIGS. 5-7. Additionally, the controller 202 may be configured to run various combinations of the process blocks 803 . . . 812b as needed to combine with any of the one or more algorithms described with respect to FIGS. 5-7. In accordance with various embodiments of the present disclosure as described with respect to FIG. 8, the controller 202 may be configured to identify specific battery cells within the battery assembly meeting any one or more of the conditions described with respect to FIGS. 5-7.

During charging or discharging of a battery assembly, there will eventually exist a battery cell possessing the weakest performance. Because weak performance is associated with low capacity and high DCIR, such a battery cell may have the lowest voltage, highest temperature, and/or greatest voltage difference.

In the process block 801, the controller 202 may be initialized. In the process block 802, voltage, temperature, and current data may be obtained from the various sources within the system 200.

If the battery assembly 204 is determined to be discharging in the process block 803, the position of the temperature sensor 206 measuring the maximum temperature is determined in the process block 805a, the position of the battery cell measured to have the minimum battery cell voltage is determined in the process block 805b, and the position of the battery cell measured to have the maximum value of the difference between average and minimum voltage is determined in the process block 805c.

If the battery assembly 204 is determined to be charging in the process block 804, the position of the battery cell measured to have the maximum value of the difference between the average and maximum cell voltage is determined in the process block 807a, the position of the battery cell measured to have the maximum battery cell voltage is determined in the process block 807b, and the position of the temperature sensor 206 measuring the maximum temperature is determined in the process block 807c.

Note that the system 200 may be configured so that the position of the battery cell(s) in closest proximity to, or otherwise associated with, each of the temperature sensors 206 is known. In such an instance, either or both of the process blocks 805a, 807c may be configured so that it identifies the position of such battery cell(s) in closest proximity to, or otherwise associated with, the temperature sensor 206 measuring the maximum temperature.

The values determined in the process blocks 805a-805c, 807a-807c may be stored in the process block 808. In the process block 809, one or more of these position values may be compared by the controller 202 to the corresponding previously determined position values stored within the memory of the controller 202. For example, in accordance with embodiments of the present disclosure, when the battery assembly 204 was first assembled (or at any other time during the subsequent operation of the system 200, including, but not limited to, each time the controller 202 is initialized), the controller 202 may be configured to perform iterations of any of the process blocks 802 . . . 807c in order to collect any one or more of the values determined in the process blocks 805a-805c, 807a-807c to be saved as values within the memory of controller 202 (e.g., see the process block 808).

Nevertheless, by tracking such position values over time, it can be determined if one or more particular battery cells begin to consistently be determined to have any one or more of the associated parameters determined in the process blocks 805a-805c, 807a-807c. If so, this may indicate that the particular one or more battery cells is aging more quickly than other battery cells within the battery assembly 204.

For example, the process block 811 may be configured to determine from the comparison performed by the process block 809 whether the battery cell position values are different than the previous iteration, and if the determined battery cell position stops changing a predetermined threshold number of times, then the process block 812a may output an indication that the particular battery cell, and maybe the entire battery assembly 204, has aged beyond an acceptable limit. If the process block 811 determines from the comparison performed by the process block 809 that the battery cell position values are not different than the previous iteration, and if the determined battery cell position keeps changing, then the process block 812b may output an indication that the particular battery cell, and maybe the entire battery assembly 204, has not aged beyond an acceptable limit. Such outputs may be transmitted from the controller 202 to an external device (e.g., the PMU or host system 301).

Such position tracking information may be stored in the memory of the controller 202 (see the process block 810). Moreover, in accordance with embodiments of the present disclosure, one or more of the algorithms described with respect to FIGS. 5-7 may also be performed by the controller 202 in conjunction with one or more of the algorithms described with respect to FIG. 8. As a result, the controller 202 may be configured to determine a position of which of the plurality of battery cells in the assembly that has the minimum, or lowest, voltage during any given discharge such that the position of this minimum voltage battery cell could be tracked over time as a mechanism to indicate aging. The controller 202 may be configured to determine a position of a temperature sensor with the highest temperature as an indicator of cooling properties or a predictor for battery cell aging due to temperature gradients or increased battery cell impedance. The controller 202 may be configured to determine a position of a battery cell that has a maximum voltage during charge such that the position of this battery cell could be tracked over time as a mechanism to indicate aging. The controller 202 may be configured to calculate various voltage and temperature differences across the plurality of battery cells and temperature sensors in the battery assembly 204, and keep record of this information in the memory of the controller 202 (e.g., see the process block 810) as a tracking method for battery assembly aging and state of health. The controller 202 may be configured to create a histogram of battery cell positions as a tracking method for battery cell aging. The controller 202 may be configured to track position(s) of one or more of the battery cells and its impedance as an indicator for battery assembly state of health. Moreover, the controller 202 may be configured to include combinations of voltage and temperature data for decision making processes related to battery safety or state of health.

In accordance with embodiments of the present disclosure, and as also described herein, the processes/algorithms performed within the controller 202 are configured to perform certain aspects as described with respect to the process blocks of FIGS. 4-8. As will be appreciated by one skilled in the art, aspects of the present disclosure may be embodied as a system, method, process, and/or program product. Accordingly, aspects of the present disclosure may take the form of an entirely hardware embodiment, an entirely software embodiment (including firmware, resident software, micro-code, etc.), or embodiments combining software and hardware aspects that may all generally be referred to herein as a "circuit," "circuitry," or "system." Furthermore, aspects of the present disclosure may take the form of a program product embodied in one or more computer-readable storage medium(s) having computer-readable program code embodied thereon. (However, any combination of one or more computer-readable medium(s) may be utilized. The computer-readable medium may be a computer-readable signal medium or a computer-readable storage medium.)

A computer-readable storage medium may be, for example, but not limited to, an electronic, magnetic, optical, electromagnetic, infrared, biologic, atomic, or semiconductor system, apparatus, controller, or device, or any suitable combination of the foregoing. More specific examples (a non-exhaustive list) of the computer-readable storage medium may include the following: an electrical connection having one or more wires, a portable computer diskette, a hard disk, a random access memory ("RAM"), a read-only memory ("ROM"), an erasable programmable read-only memory ("EPROM" or Flash memory), an optical fiber, a portable compact disc read-only memory ("CD-ROM"), an optical storage device, a magnetic storage device, or any suitable combination of the foregoing. In the context of this document, a computer-readable storage medium may be any tangible medium that can contain or store a program for use by or in connection with an instruction execution system, apparatus, controller (e.g., the controller 202), or device. Program code embodied on a computer-readable signal medium may be transmitted using any appropriate medium, including but not limited to wireless, wire line, optical fiber cable, RF, etc., or any suitable combination of the foregoing.

The flowchart diagram and block diagrams in the figures illustrate architecture, functionality, and operation of possible implementations of systems, methods, processes, and program products according to various embodiments of the present disclosure. In this regard, each block in the flowchart diagram or block diagrams may represent a module, segment, or portion of software code, which includes one or more executable program instructions for implementing the specified logical functions. It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

These program instructions may be provided to a processor and/or controller of a general-purpose computer, special purpose computer, or other programmable data processing apparatus (e.g., the controller 202) to produce a machine, such that the instructions, which execute via the processor of the computer or other programmable data processing apparatus, create means for implementing the functions/acts specified in the flowchart and/or block diagram block or blocks.

It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. For example, a module may be implemented as a hardware circuit comprising custom VLSI circuits or gate arrays, off-the-shelf semiconductors such as logic chips, transistors, controllers (e.g., the controller 202), or other discrete components. A module may also be implemented in programmable hardware devices such as field programmable gate arrays, programmable array logic, programmable logic devices, or the like.

Computer program code, i.e., instructions, for carrying out operations for embodiments of the present disclosure may be written in any combination of one or more programming languages, including an object-oriented programming language such as Java, Smalltalk, C++ or the like and conventional procedural programming languages, such as the "C" programming language or similar programming languages.

These program instructions may also be stored in a computer-readable storage medium that can direct a computer, other programmable data processing apparatus, controller (e.g., the controller 202), or other devices to function in a particular manner, such that the instructions stored in the computer-readable medium produce an article of manufacture including instructions which implement the function/act specified in the flowchart and/or block diagram block or blocks.

The program instructions may also be loaded onto a computer, other programmable data processing apparatus, controller (e.g., the controller 202), or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to FIG. 9, a block diagram illustrating a data processing system 901 is depicted in which aspects of embodiments of the disclosure may be implemented. In accordance with embodiments of the present disclosure, the controller 202 may be implemented with various aspects of the data processing system 901. Data processing system 901 may employ a peripheral component interconnect ("PCI") local bus architecture. Although the depicted example employs a PCI bus, other bus architectures such as Accelerated Graphics Port ("AGP") and Industry Standard Architecture ("ISA") may be used, among others. Processor 915, volatile memory 920, and non-volatile memory 935 may be connected to the local bus 905 through a PCI Bridge (not shown). The PCI Bridge also may include an integrated memory controller and cache memory for processor 915. Additional connections to the local bus 905 may be made through direct component interconnection or through add-in boards. In the depicted example, a LAN adapter 925, small data processing system interface ("SCSI") host bus adapter (not shown), and expansion bus interface (not shown) may be connected to the local bus 905 by direct component connection. In contrast, an audio adapter (not shown), a graphics adapter (not shown), and a display adapter 914 and display 960 may be coupled to the local bus 905 by add-in boards inserted into expansion slots. A user interface adapter 930 may provide a connection for a keyboard 931 and a mouse 932. An I/O adapter 940 may provide a connection for a hard disk drive 941, a tape drive, and a CD-ROM/DVD drive 942.

An operating system may be run on processor 915 and used to coordinate and provide control of various components within the data processing system 1001. The operating system may be a commercially available operating system. An object-oriented programming system such as Java may run in conjunction with the operating system and provide calls to the operating system from Java programs or programs executing on the system 1001. Instructions for the operating system, the object-oriented operating system, and programs may be located on the non-volatile memory 935 storage devices, such as the hard disk drive 941, and may be loaded into the volatile memory 920 for execution by the processor 915.

Those of ordinary skill in the art will appreciate that the hardware in FIG. 9 may vary depending on the implementation, and may vary in order to implement the controller 202. Other internal hardware or peripheral devices, such as flash ROM (or equivalent nonvolatile memory) and the like, may be used in addition to or in place of the hardware depicted in FIG. 9.

As another example, the data processing system 1001 may be a stand-alone system configured to be bootable without relying on some type of network communication interface, whether or not the data processing system 1001 includes some type of network communication interface. As a further example, the data processing system 1001 may be an embedded controller (e.g., the controller 202), which is configured with ROM and/or flash ROM providing non-volatile memory storing operating system files or user-generated data.

The depicted example in FIG. 9 and above-described examples are not meant to imply architectural limitations. Further, a computer program form of the present disclosure may reside on any computer-readable storage medium (i.e., floppy disk, compact disk, hard disk, tape, ROM, RAM, etc.) used by a data processing system.

Unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present). As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

Also, the use of "a" or "an" is employed to describe elements and resources described herein. This is done merely for convenience, and to give a general sense of the scope of the disclosure. This description should be read to include one, or at least one, and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this disclosure belongs. Although methods and materials similar or equivalent to those described herein can be used in the practice or testing of embodiments of the present disclosure, suitable methods and materials are described herein.

To the extent not described herein, many details regarding specific materials, processing acts, and circuits are conventional, and may be found in textbooks and other sources within the computing, electronics, and software arts.

It will be understood that particular embodiments described herein are shown by way of illustration and not as limitations of the disclosure. The principal features of this disclosure can be employed in various embodiments without departing from the scope of the disclosure.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that is capable of" performing the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke a 35 U.S.C. § 112(f) interpretation for that unit/circuit/component.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

To the extent not described herein, many details regarding specific materials, processing acts, and circuits are conventional, and may be found in textbooks and other sources within the computing, electronics, and software arts.

In the description herein, a flow-charted technique may be described in a series of sequential actions. The sequence of the actions may be freely changed without departing from the scope of the teachings. Actions may be added, deleted, or altered in several ways. Similarly, the actions may be re-ordered or looped. Further, although processes, methods, algorithms, or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

Reference throughout this specification to "an embodiment," "embodiments," "certain embodiments," or similar language means that a particular feature, structure, or characteristic described in connection with the embodiments is included in at least one embodiment of the present disclosure. Thus, appearances of the phrases "in one embodiment," "in an embodiment," "embodiments," "certain embodiments," "various embodiments," and similar language throughout this specification may, but do not necessarily, all refer to the same embodiment. Furthermore, the described features, structures, aspects, and/or characteristics of the disclosure may be combined in any suitable manner in one or more embodiments. Correspondingly, even if features may be initially claimed as acting in certain combinations, one or more features from a claimed combination can in some cases be excised from the combination, and the claimed combination can be directed to a sub-combination or variation of a sub-combination.

Benefits, advantages, and solutions to problems have been described above with regard to specific embodiments. However, the benefits, advantages, solutions to problems, and any element(s) that may cause any benefit, advantage, or solution to occur or become more pronounced may be not to be construed as critical, required, or essential features or elements of any or all the claims. Further, no component described herein is required for the practice of the disclosure unless expressly described as essential or critical.

What is claimed is:

1. A method for monitoring a plurality of battery cells in a multi-cell battery assembly, comprising:
   receiving a voltage measurement from each of the plurality of battery cells at the analog front end;
   receiving an output from an analog front end, wherein the output from the analog front end is a data signal produced as a function of received voltage measurements from each of the plurality of battery cells;
   producing a digital signal representing a voltage value associated with one of the plurality of battery cells having a reduced capacity relative to the remaining battery cells in the multi-cell battery assembly;
   converting the digital signal representing a voltage value to an analog voltage signal; and
   processing the analog voltage signal by a fuel gauge.

2. The method as recited in claim 1, wherein the voltage value is selected from a group consisting of a maximum voltage of the voltage measurements, a minimum voltage of the voltage measurements, and an average voltage of the plurality of battery cells, wherein the digital signal representing the minimum voltage value is produced during discharging of the multi-cell battery assembly, and wherein the digital signal representing the maximum voltage value is produced during charging of the multi-cell battery assembly, and wherein the digital signal representing the average voltage value is produced during resting of the multi-cell battery assembly.

3. The method as recited in claim 1, wherein the fuel gauge is a single-cell fuel gauge having a first single analog input for measuring battery cell terminal voltage and a second single analog input for measuring battery cell temperature.

4. The method as recited in claim 2, wherein the group of voltage values further consists of a first difference between a minimum voltage of the voltage measurements and an average voltage of the plurality of battery cells, a second difference between a minimum voltage of the voltage measurements and a maximum voltage of the voltage measurements, and a third difference between a maximum voltage of the voltage measurements and an average voltage of the plurality of battery cells, wherein a digital signal representing the first difference is produced during discharging of the multi-cell battery assembly, and wherein a digital signal representing the second difference is produced during discharging of the multi-cell battery assembly, and wherein a digital signal representing the third difference is produced during charging of the multi-cell battery assembly.

5. The method as recited in claim 4, further comprising determining whether the multi-cell battery assembly has aged beyond a predetermined threshold as a function of a change in any one of the first, second, or third differences over time.

6. The method as recited in claim 1, further comprising identifying the one of the plurality of battery cells having the reduced capacity relative to the remaining battery cells in the multi-cell battery assembly.

7. The method as recited in claim 1, further comprising tracking over time identities of various ones of the plurality of battery cells having a reduced capacity relative to the other battery cells in the multi-cell battery assembly.

8. The method as recited in claim 1, further comprising:
receiving a temperature value corresponding to a temperature measurement made by one of a plurality of temperature sensors in physical proximity to selected ones of the plurality of battery cells in the multi-cell battery assembly, wherein the temperature value is a maximum temperature of temperature measurements made by the plurality of temperature sensors; and
identifying the temperature sensor having the maximum temperature.

* * * * *